US00RE43761E

(19) United States
(12) Reissued Patent
Chao et al.

(10) Patent Number: US RE43,761 E
(45) Date of Reissued Patent: *Oct. 23, 2012

(54) JITTER MEASURING METHOD AND DEVICE

(75) Inventors: Ming-Yang Chao, Hsin She Hsiang (TW); Szu-Shan Lo, Hsinchu (TW)

(73) Assignee: Mediatek Inc., Hsin Chu (TW)

( * ) Notice: This patent is subject to a terminal disclaimer.

(21) Appl. No.: 12/727,113

(22) Filed: Mar. 18, 2010

Related U.S. Patent Documents

Reissue of:
(64) Patent No.: 6,829,295
Issued: Dec. 7, 2004
Appl. No.: 10/438,823
Filed: May 16, 2003

U.S. Applications:
(63) Continuation of application No. 11/599,634, filed on Nov. 15, 2006, now Pat. No. Re. 41,195.

(30) Foreign Application Priority Data

May 20, 2002 (TW) ..... 91110832 A

(51) Int. Cl.
*H04B 17/00* (2006.01)

(52) U.S. Cl. ..... 375/226

(58) Field of Classification Search ..... 375/224, 375/226, 371, 354; 702/66, 69; 369/53.1, 369/53.24
See application file for complete search history.

(56) References Cited

U.S. PATENT DOCUMENTS

| | | | | |
|---|---|---|---|---|
| 3,551,826 | A * | 12/1970 | Sepe | 327/119 |
| 4,975,660 | A * | 12/1990 | Svenson | 331/1 A |
| 5,337,335 | A * | 8/1994 | Cloetens et al. | 375/376 |
| 5,692,009 | A | 11/1997 | Iijima | |
| 6,549,571 | B1 * | 4/2003 | Baba | 375/224 |
| 2002/0018417 | A1 * | 2/2002 | Morishima | 369/47.53 |

* cited by examiner

*Primary Examiner* — Tesfaldet Bocure
(74) *Attorney, Agent, or Firm* — Muncy, Geissler, Olds & Lowe, PLLC

(57) ABSTRACT

A jitter measuring method and device, which is capable of measuring jitters in serial digital signal without high-frequency reference clock. The jitter measuring device comprises a rough length measuring unit for measuring rough length for each pulse of the serial digital signal according to a reference clock, and a phase error measuring unit for measuring the phase errors between the edges of the reference clock and the serial digital signal by multi-phase clocks, which are generated by a multi-phase generator according to the reference clock. The jitter measuring device computes the precise length according to the rough length and the phase error, and measures the jitters from the precise length by filters.

9 Claims, 6 Drawing Sheets

| Phase difference signal | Phase difference length |
|---|---|
| 10000111 | 0 * P / 8 |
| 11000011 | 1 * P / 8 |
| 11100001 | 2 * P / 8 |
| 11110000 | 3 * P / 8 |
| 01111000 | 4 * P / 8 |
| 00111100 | 5 * P / 8 |
| 00011110 | 6 * P / 8 |
| 00001111 | 7 * P / 8 |

JITTER MEASURING METHOD AND DEVICE

Matter enclosed in heavy brackets [ ] appears in the original patent but forms no part of this reissue specification; matter printed in italics indicates the additions made by reissue.

*CROSS REFERENCE TO RELATED APPLICATIONS*

*This application is a Continuation of application Ser. No. 11/599,634, filed on Nov. 15, 2006 now U.S. Pat. No. Re. 41,195, which is a reissue of U.S. Pat. No. 6,829,295 B2, issued on Dec. 7, 2004, for which priority is claimed under 35 U.S.C. §120; and this application claims priority of Application No. 091110832 filed in Taiwan, R.O.C. on May 20, 2002, under 35 U.S.C. §119.*

BACKGROUND OF THE INVENTION

1. Field of the Invention

The invention relates to a jitter measuring method and device, and more particularly to a jitter measuring method and device for precisely calculating the length of a serial digital signal according to a multi-phase clock to measure the jitter correctly.

2. Description of the Related Art

In an optical storage apparatus, a jitter measuring device (jitter meter) is an important device. The measurement result of the jitter measuring device is an indicator for the signal quality. If a jitter measuring device with precise result is employed in the optical storage apparatus, the optical storage apparatus can acquire correct signal information and adjust itself to an optimum state. The jitter measuring method is typically divided into a digital method and an analog method.

The digital method includes the steps of shaping the serial digital signal, calculating the number of pulses of a reference clock for each pulse of the shaped signal, and then finding out a difference value between the calculated numbers as the jitter value. The drawbacks of this method are that it is necessary to provide the reference clock with higher frequency if the frequency of the serial digital signal is high.

The analog method includes the steps of converting each pulse width of the serial digital signal into an analog signal, and then filtering the voltage of the analog signal by a filter. The filtered voltage variation represents the jitter value. The drawbacks of this method are that the switching speed of the used switches may greatly influence the measurement result, and the switches with a high switching speed cannot be easily implemented.

SUMMARY OF THE INVENTION

In view of the above-mentioned problems, an object of the invention is to provide a jitter measuring method and device capable of precisely measuring jitters in a serial digital signal without a high-frequency reference clock.

To achieve the above-mentioned object, the jitter measuring device of the invention includes a rough length measuring unit, a multi-phase signal generator, a phase error measuring unit, a length integrating unit, a pulse selecting unit, an average length calculating unit, a length difference calculating unit, and a jitter calculating unit. The rough length measuring unit receives a serial digital signal and a reference clock and generates a rough pulse length for each pulse of the serial digital signal. The multi-phase signal generator generates a plurality of multi-phase clocks according to the reference clock. The phase error measuring unit receives the serial digital signal, the reference clock and the multi-phase clocks, and generates a positive edge phase error and a negative edge phase error. The length integrating unit receives the rough pulse length, the positive edge phase error and the negative edge phase error, and computes a pulse length for each pulse of the serial digital signal. The pulse selecting unit selects the pulse lengths as selected pulse lengths according to a length selection signal. The average length calculating unit receives the selected pulse lengths and computes an average pulse length of the selected pulse lengths. The length difference calculating unit receives the selected pulse lengths and the average pulse length and computes length differences between the selected pulse lengths and the average pulse length. The jitter calculating unit receives the length differences and computes an average of the length differences as a jitter.

Since the jitter measuring device of the invention measures the jitter in the serial digital signal according to the reference clock having lower frequency, the need for providing a reference clock having high frequency can be avoided.

DETAILED DESCRIPTION OF THE INVENTION

The jitter measuring method and device of the present invention will be described in detail with reference to the accompanying drawings.

Figure 1:
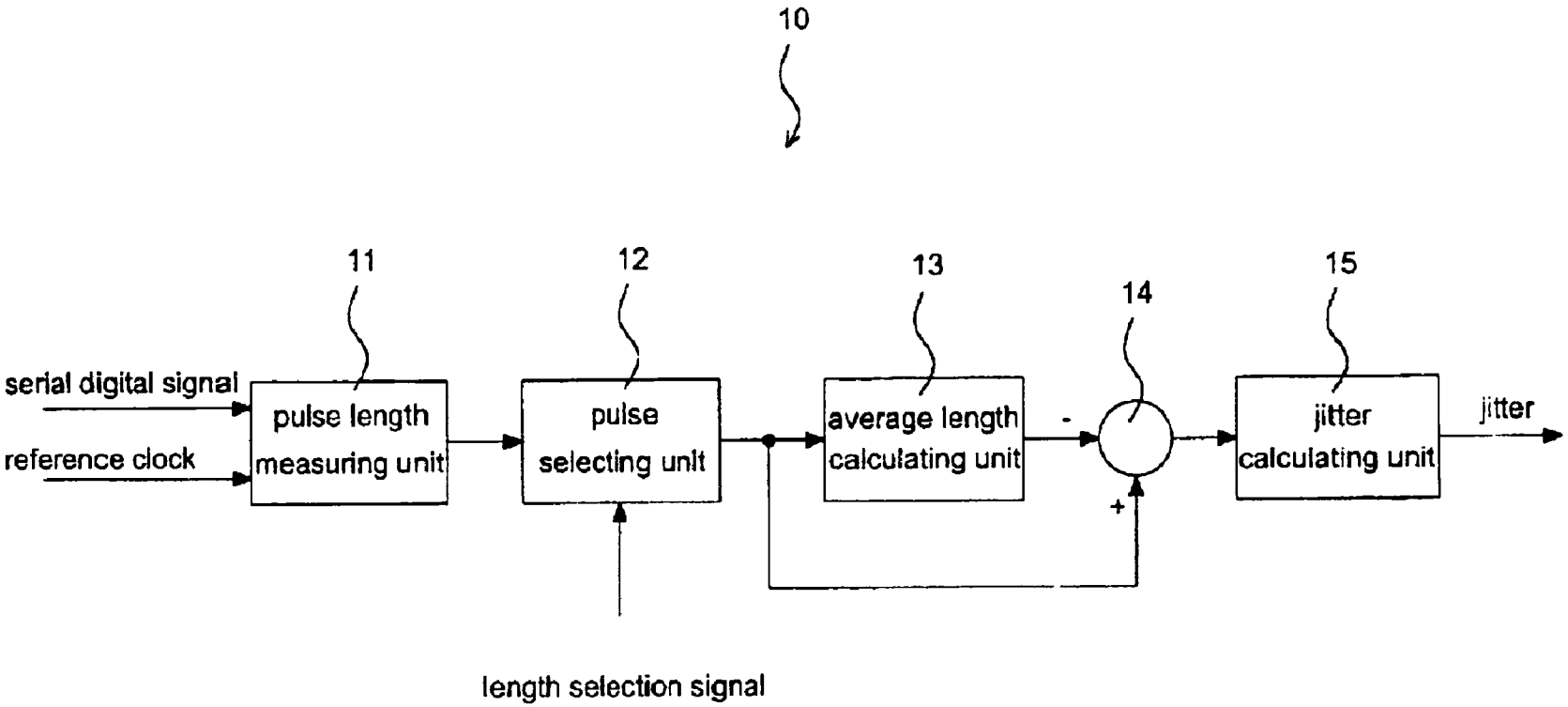
FIG. 1 is a block diagram showing a jitter measuring device of the present invention.

FIG. 1 is a block diagram showing a jitter measuring device of the present invention. Referring to FIG. 1, the jitter measuring device 10 of the present invention includes a pulse length measuring unit 11, a pulse selecting unit 12, an average length calculating unit 13, a length difference calculating unit 14, and a jitter calculating unit 15. The pulse length measuring unit 11 receives a serial digital signal and precisely measures the pulse length for each pulse of the serial digital signal according to a reference clock and a plurality of multi-phase clocks, which are generated according to the reference clock. The pulse lengths of the serial digital signal have several ranges. For example, the serial digital signal acquired from the CD-ROM has the pulse lengths ranging from 3T to 11T, wherein T denotes a basic period unit for the serial digital signal. So, the jitter measuring device 10 employs the pulse selecting unit 12 to select the pulse lengths as selected pulse lengths corresponding to a length selection signal. The average length calculating unit 13 calculates an average length of the selected pulse lengths. The length difference calculating unit 14 calculates length differences between the length of each selected pulse length and the average length. Finally, the jitter calculating unit 15 calculates an average of the length differences as a jitter for output.

Figure 2:
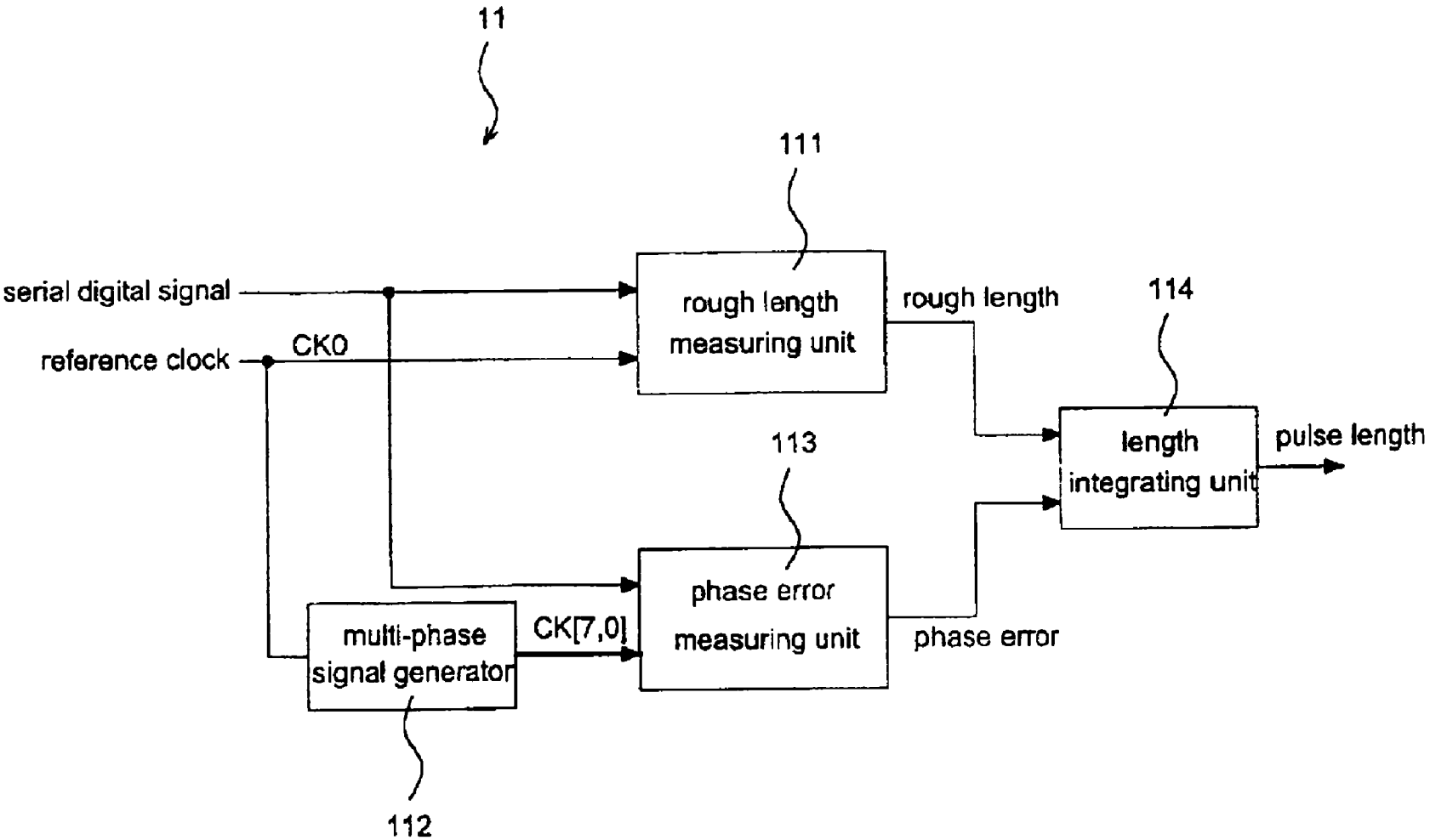
FIG. 2 is a block diagram showing a pulse length measuring unit according to an embodiment of the invention.

FIG. 2 is a block diagram showing a pulse length measuring unit according to an embodiment of the invention. Referring to FIG. 2, the pulse length measuring unit 11 includes a rough length measuring unit 111, a multi-phase signal generator 112, a phase error measuring unit 113, and a length integrating unit 114. The conventional pulse length measuring unit directly measures the pulse length for each pulse of the serial digital signal according to a high-frequency reference clock having a frequency that is several-ten times higher than that of the serial digital signal. The invention, however, measures precisely the pulse length for each pulse of the serial digital signal according to a high-frequency reference clock having a frequency that is equal to or several times higher than that of the serial digital signal. The rough length measuring unit 111 directly measures the rough pulse length for each pulse of the serial digital signal according to the reference clock CK0. Because the frequency of the reference clock CK0 is not so high, the rough length measuring unit 111 only measures a rough pulse length. The pulse length measuring unit 11 utilizes the multi-phase signal generator 112 to generate a plurality of multi-phase clocks (e.g., CK1 to CK7) having the same frequency as the reference clock CK0 but having different phases. The phase error measuring unit 113 measures the phase errors between the positive and negative edges for each pulse of the serial digital signal according to the clocks CK0 to CK7. Then, the pulse length measuring unit 11 utilizes the length integrating unit 114 to integrate the rough pulse length with the phase errors between the positive and negative edges. Thus, the pulse length of the serial digital signal is precisely measured.

Figure 3:
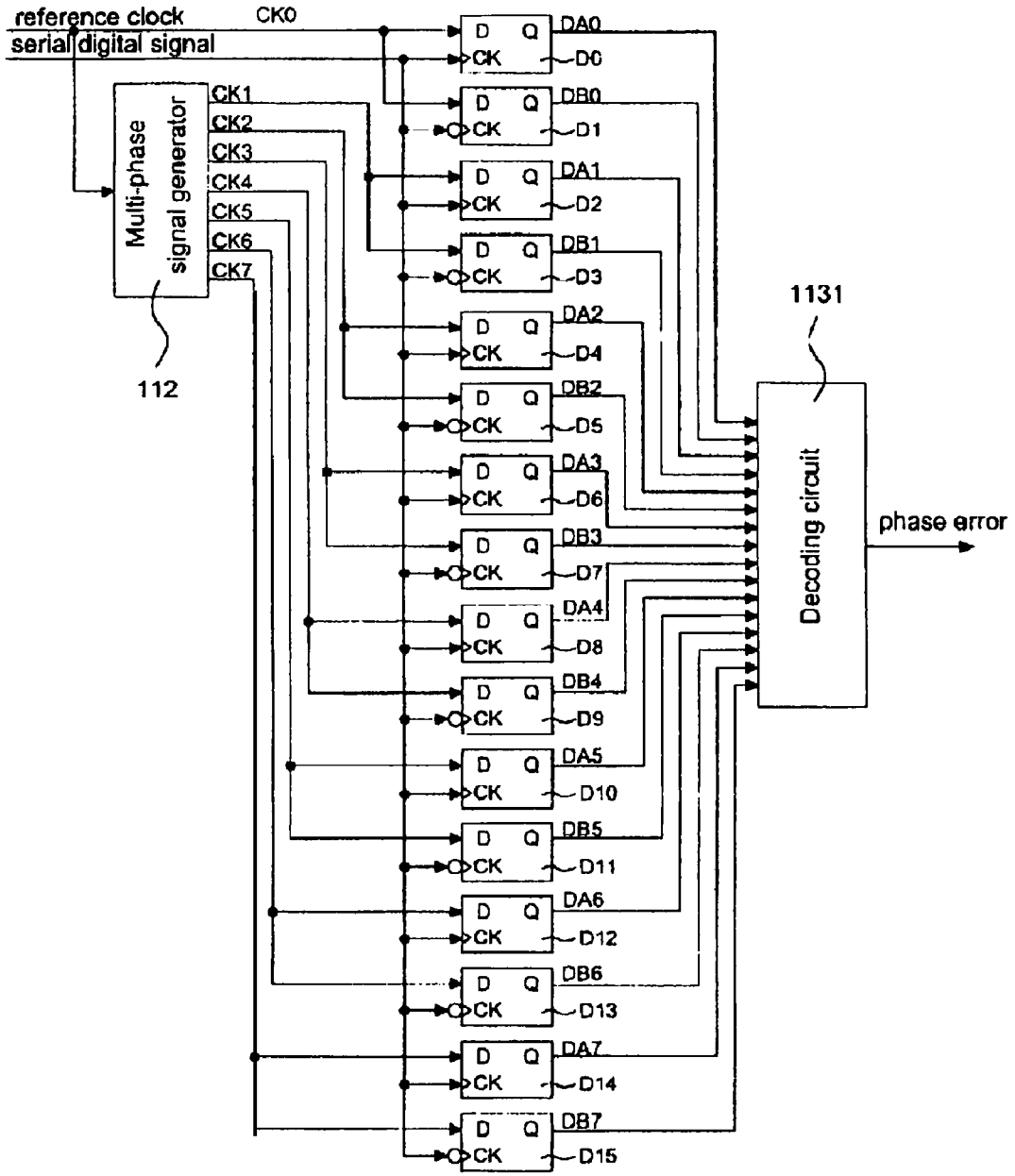
FIG. 3 is a block diagram showing a phase error measuring unit.

FIG. 3 is a block diagram showing a phase error measuring unit. As shown in FIG. 3, assume that the multi-phase signal generator 112 generates seven multi-phase clocks CK1 to CK7. The phase error measuring unit 113 receives the reference clock CK0 and the multi-phase clocks CK1 to CK7. The phase error measuring unit 113 utilizes eight sets of D flip-flop to receive the reference clocks CK0, the multi-phase clocks CK1 to CK7 and the serial digital signal. Each set of D flip-flop includes a positive-edge triggered flip-flop and a negative-edge triggered flip-flop, and the serial digital signal serves as a trigger signal for all D flip-flops, while the reference clock CK0 and multi-phase clocks CK1 to CK7 serve as an input signal of one set of D flip-flop, respectively. Consequently, the eight sets of D flip-flop generate a set of positive edge phase error signal DA[0,7] from the eight positive-edge triggered flip-flops, and a set of negative edge phase error signal DB[0,7] from the eight negative-edge triggered flip-flops. A decoding circuit 1131 generates a phase error between the positive and negative edges according to the positive edge phase error signal DA[0,7] and the negative edge phase error signal DB[0,7].

Figure 4:
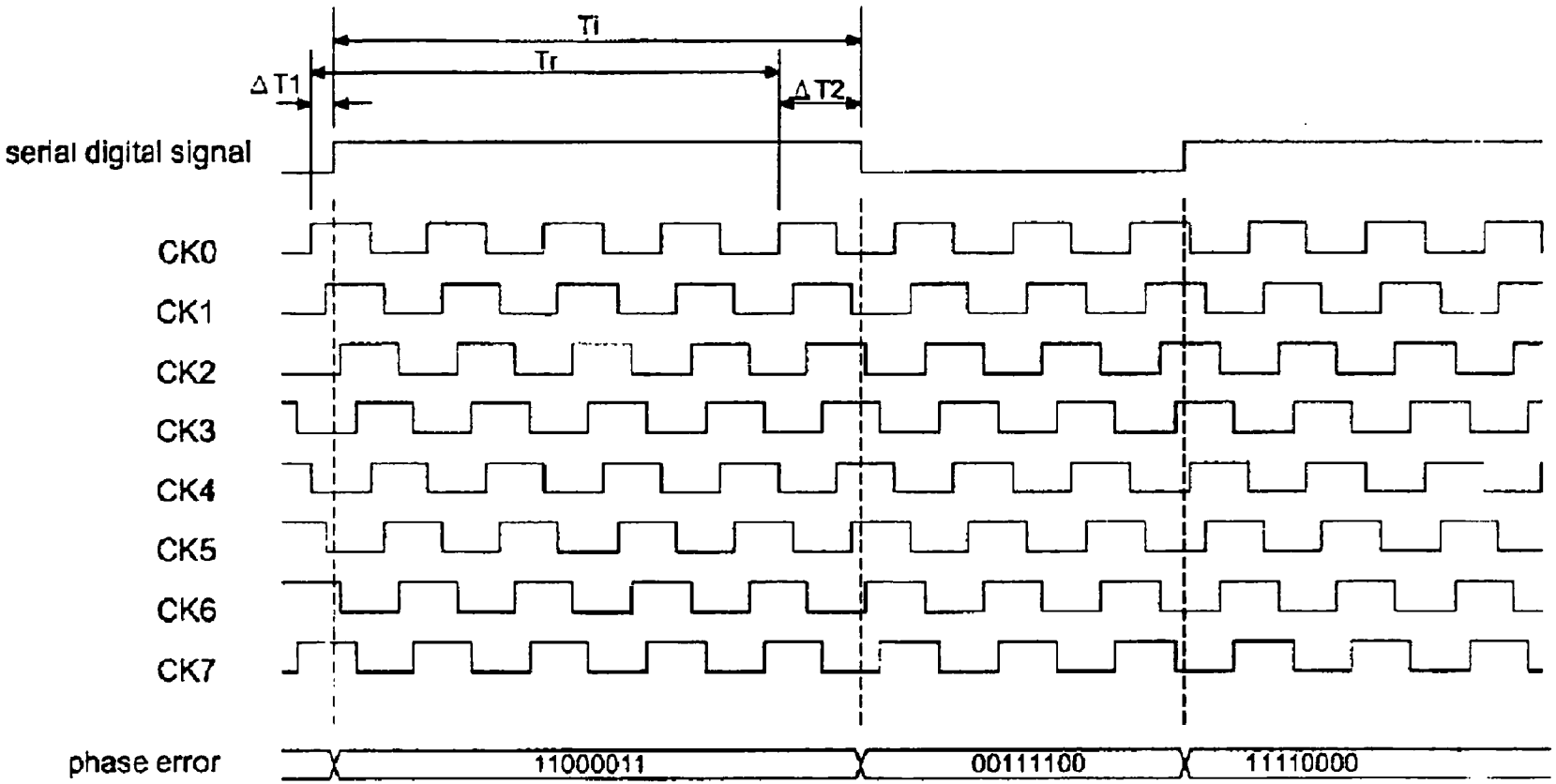
FIG. 4 is a timing diagram showing the serial digital signal, a reference clock and a plurality of multi-phase clocks.

FIG. 4 is a timing diagram of the serial digital signal, the reference clock CK0 and the multi-phase clocks CK1 to CK7, wherein Ti represents the pulse length for each pulse of the serial digital signal, Tr represents the rough pulse length, ΔT1 represents the positive edge phase error, and ΔT2 represents the negative edge phase error. Assume that the period length of the reference clock CK0 is P, and the period length P is the same as the basic period unit T of the serial digital signal in this embodiment for the sake of illustration. Of course, the shorter the period length P, the higher the measured resolution. First, the rough length measuring unit 111 directly measures the rough pulse length for each pulse of the serial digital signal by counting the pulse number of the reference clock CK0. Thus, as shown in the drawing, Tr equals to four periods of the reference clock (i.e., Tr=4P). In addition, the positive edge phase error signal DA[0,7] is the output value generated from the eight positive-edge triggered flip-flops triggered at the positive edges of the serial digital signal. Thus, the positive edge phase error signal DA[0,7] in FIG. 4 are "11000011." Similarly, the negative edge phase error signal DB[0,7] is the output value generated from the eight negative-edge triggered flip-flops triggered at the negative edges of the serial digital signal. Thus, the negative edge phase error signal DB[0,7] in FIG. 4 are "00111100." The decoding circuit 1131 generates the phase errors ΔT1 and ΔT2 according to the phase error signals DA[0,7] and DB[0,7].

Figures 5, 6:
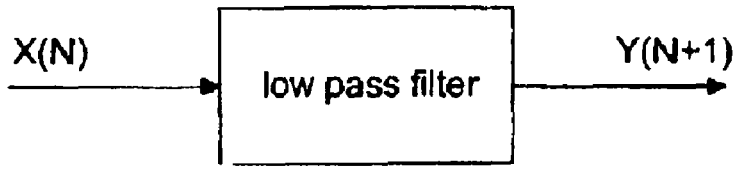
FIG. 5 shows an encoding embodiment of the decoding circuit of the invention.
FIG. 6 shows an embodiment of an average length calculating unit.

FIG. 5 shows a decoding embodiment of the decoding circuit of the invention, wherein P represents the period length of the reference clock CK0. As shown in FIG. 5, the phase error signals DA[0,7] and DB[0,7] only have eight states corresponding to eight phase errors, respectively. For example, the phase error signal "10000111" corresponds to the phase error of 0*P/8, that is, the positive or negative edge of the serial digital signal and the reference clock CK0 have the same phase. On the other hand, the phase error signal "11000011" corresponds to the phase error of 1*P/8, that is, the positive or negative edge of the serial digital signal and the reference clock CK1 has the same phase, and so on. Of course, one reference clock and seven multi-phase clocks are illustrated as an example in this embodiment. If one reference clock and nine multi-phase clocks are illustrated as an example, the phase error signal is a ten-bit signal and has ten states. Therefore, the more the multi-phase clocks, the higher the measured resolution.

Please refer to FIGS. 2 and 4 again. After the rough length measuring unit 111 and the phase error measuring unit 113 have measured the rough length and the phase error, respectively, the pulse length measuring unit 11 utilizes the length integrating unit 114 to calculate the fine pulse length of the serial digital signal according to the rough pulse length and the phase errors between the positive and negative edges. The calculating method is shown in Equation (1):

$$Ti=Tr-\Delta T1+\Delta T2 \quad (1).$$

Since the pulse length Ti of the serial digital signal have different period ranges (for example, the range of CD-ROM system is from 3T to 11T), the jitter measuring device 10 of the invention utilizes the pulse selecting unit 12 to select the pulse lengths having the same range to calculate the jitter in the serial digital signal. The pulse selecting unit 12 selects the pulse lengths having the same range according to a length selection signal and outputs the pulse lengths as selected pulse lengths. For instance, if the length selection signal is 5, the pulse selecting unit 12 selects the pulse lengths close to 5T as the selected pulse lengths. Of course, the pulse selecting unit 12 may immediately output the selected pulse lengths close to the length selection signal. Alternatively, a memory may be utilized to store all the pulse lengths, and the pulse lengths close to the length selection signal may be output after a period of time.

Then, the jitter measuring device 10 of the present invention utilizes an average length calculating unit 13 to calculate an average length Ta of the selected pulse lengths Ti. The average length calculating unit 13 may be a low-pass filter, as shown in FIG. 6. If the low-pass filter is a 1/M average system, X(N) represents the input of time of N, and Y(N+1) represents the output of time of (N+1), then the output of the low-pass filter is:

$$Y(N+1)=(1/M)*X(N)+[(M-1)/M]*Y(N) \quad (2).$$

In this embodiment, the selected pulse lengths Ti is the input data X(N) and the average length Ta is the output data Y(N+1).

Next, the jitter measuring device 10 utilizes the length difference calculating unit 14 to calculate the length differences between each selected pulse length Ti and the average length Ta. The length difference calculating unit 14 may be a subtracter, which subtracts the average length Ta from the selected pulse lengths Ti to get length differences Tc. Finally, the jitter measuring device 10 utilizes the jitter calculating unit 15 to calculate an average of the length differences as a jitter for output. Similar to the average length calculating unit 13, the jitter calculating unit 15 may be implemented by a low-pass filter.

Figure 7:
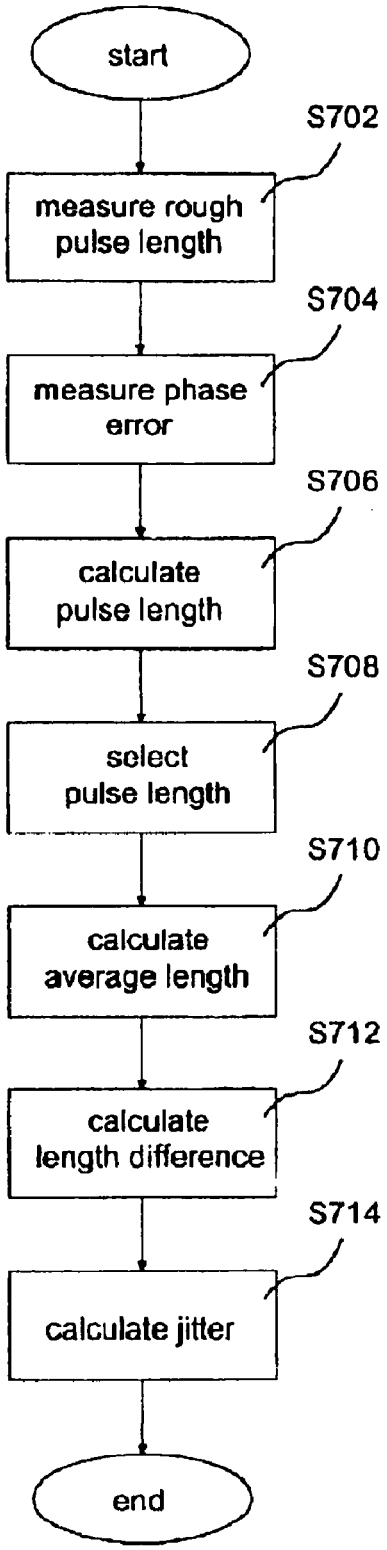
FIG. 7 is a flow chart showing a jitter measuring method of the invention.

FIG. 7 is a flow chart showing a jitter measuring method of the present invention. The method includes the following steps.

Step S702: measuring the rough pulse length for each pulse of the serial digital signal, wherein the rough pulse length for each pulse of the serial digital signal is the pulse number of a reference clock during the pulse. The frequency of the reference clock does not have to be too high.

Step S704: measuring the phase errors, wherein the phase error between the positive/negative edge of the serial digital signal and the positive edge of the reference clock is measured according to a plurality of multi-phase clocks. Because the multi-phase clocks are generated according to the reference clock, the multi-phase clocks and the reference clock have the same frequency.

Step S706: calculating the fine pulse length according to the rough pulse length and the phase errors. The fine pulse length is calculated by subtracting the rough pulse length from the positive edge phase error, and then by adding the negative edge phase error to get the fine pulse length.

Step S708: selecting the fine pulse lengths matching the length selection signal as the selected pulse lengths Ti. Because the fine pulse lengths are not fixed length (for example, the pulse lengths of the CD-ROM system are between 3T and 11T), the fine pulse lengths having the same range have to be selected to compute the jitter. Alternately, it is possible to select fine pulse lengths matching one of two or more length selection signals.

Step S710: calculating the average length of the selected pulse lengths Ti as an average pulse length Ta.

Step S712: calculating the length errors between each selected pulse length Ti and the average pulse length Ta. The length errors can be the length differences or the length standard deviation.

Step S714: calculating the jitter by calculating the average of the length errors.

In summary, the jitter measuring device of the present invention measures the jitter in the serial digital signal according to the reference clock having lower frequency, and is free from the problem of providing a reference clock having high frequency accordingly.

While certain exemplary embodiments have been described and shown in the accompanying drawings, it is to be understood that such embodiments are merely illustrative of and not restrictive on the broad invention, and that this invention not be limited to the specific construction and arrangement shown and described, since various other modifications may occur to those ordinarily skilled in the art.

What is claimed is:

[1. A jitter measuring device for measuring jitters in a serial digital signal, the jitter measuring device comprising:

a pulse length measuring unit for receiving the serial digital signal and a reference clock and measuring pulse length for each pulse of the serial digital signal according to the reference clock;

a pulse selecting unit for selecting the pulse lengths corresponding to a length selection signal as selected pulse lengths;

an average length calculating unit for calculating an average pulse length among the selected pulse lengths;

a length difference calculating unit for receiving the selected pulse lengths and the average pulse length and calculating length difference for each selected pulse length with the average pulse length; and a jitter calculating unit for receiving the length differences and calculating an average of the length differences as the jitters.]

[2. The jitter measuring device according to claim 1, wherein the pulse length measuring unit comprises:

a rough length measuring unit for receiving the serial digital signal and the reference clock and generating a rough pulse length for each pulse of the serial digital signal;

a multi-phase signal generator for generating multi-phase clocks according to the reference clock;

a phase error measuring unit for receiving the serial digital signal, the reference clock and the multi-phase clocks, and generating a positive edge phase error and a negative edge phase error for each pulse of the serial digital signal; and a length integrating unit for receiving the rough pulse length, the positive edge phase error and the negative edge phase error, and calculating the pulse length for each pulse of the serial digital signal.]

[3. The jitter measuring device according to claim 2, wherein the rough length measuring unit is a counter for counting pulse number of the reference clock for each pulse as the rough pulse length.]

[4. The jitter measuring device according to claim 3, wherein the phase error measuring unit comprises:

a plurality of positive-edge triggered flip-flops generating a positive edge phase error signal by receiving the reference clock and the multi-phase clocks as input signals and receiving the serial digital signal as a trigger signal;

a plurality of negative-edge triggered flip-flops for generating a negative edge phase error signal by receiving the reference clock and the multi-phase clocks as input signals and receiving the serial digital signal as a trigger signal; and a decoder for receiving the positive edge phase error signal and the negative edge phase error signal and generating the positive edge phase error and the negative edge phase error according to a look-up table.]

[5. The jitter measuring device according to claim 4, wherein the length integrating unit performs subtraction and addition operations with respect to the rough pulse length, the positive edge phase error, and the negative edge phase error.]

[6. The jitter measuring device according to claim 5, wherein the average length calculating unit is a low-pass filter.]

[7. The jitter measuring device according to claim 5, wherein the jitter calculating unit is a low-pass filter.]

[8. The jitter measuring device according to claim 5, wherein the length difference calculating unit is a subtracter.]

[9. A jitter measuring method for measuring jitters in a serial digital signal, comprising the steps of:

generating multi-phase clocks according to a reference clock;

measuring rough pulse length for each pulse of the serial digital signal according to the reference clock;

measuring positive/negative edge phase errors of the positive/negative edges of the serial digital signal according to the reference clock and the multi-phase clocks;

calculating pulse length for each pulse according to the rough pulse length and the positive/negative edge phase errors;

selecting the pulse lengths matching one of length selection signals as selected pulse lengths;

calculating an average pulse length of the selected pulse lengths;

calculating length error for each selected pulse length with the average pulse length; and calculating an average of the length errors as the jitters.]

[10. The method according to claim 9, wherein the step of calculating the pulse length comprises:

subtracting the positive edge phase error from the rough pulse length to generate a computed result; and adding the negative edge phase error to the computed result as the pulse length.]

[11. The method according to claim 9, wherein length error is length difference.]

[12. The method according to claim 9, wherein length error is length standard deviation.]

*13. A jitter measuring method for measuring jitters in a digital signal, the jitter measuring method comprising the steps of:*

*receiving the digital signal and a reference clock;*

*measuring pulse length for each pulse of the digital signal according to the reference clock;*

*selecting the pulse lengths corresponding to a length selection signal as selected pulse lengths;*

*calculating an average pulse length among the selected pulse lengths;*

*receiving the selected pulse lengths and the average pulse length and calculating length difference for each selected pulse length with the average pulse length; and*

*receiving the length differences and calculating an average of the length differences as the jitters.*

*14. The jitter measuring method according to claim 13, wherein the step of measuring pulse length comprises:*

*receiving the digital signal and the reference clock and generating a rough pulse length for each pulse of the serial digital signal;*

*generating multi-phase clocks according to the reference clock;*

*receiving the digital signal, the reference clock and the multi-phase clocks, and generating a positive edge phase error and a negative edge phase error for each pulse of the digital signal; and*

*receiving the rough pulse length, the positive edge phase error and the negative edge phase error, and calculating the pulse length for each pulse of the digital signal.*

*15. The jitter measuring method according to claim 14, wherein the step of generating a rough pulse length is to count pulse number of the reference clock for each pulse as the rough pulse length.*

*16. The jitter measuring method according to claim 15, wherein the step of generating a positive edge phase error and a negative edge phase error comprises the steps of:*

*generating a positive edge phase error signal according to the reference clock and the multi-phase clocks as input signals and the digital signal as a trigger signal;*

*generating a negative edge phase error signal according to the reference clock and the multi-phase clocks as input signals and the digital signal as a trigger signal; and*

*receiving the positive edge phase error signal and the negative edge phase error signal and generating the positive edge phase error and the negative edge phase error according to a look-up table.*

*17. The jitter measuring method according to claim 16, wherein the step of calculating the pulse length performs subtraction and addition operations with respect to the rough pulse length, the positive edge phase error, and the negative edge phase error.*

*18. The jitter measuring method according to claim 17, wherein the step of calculating the average pulse length is to perform a low-pass filtering procedure.*

*19. The jitter measuring method according to claim 17, wherein the step of calculating the average of the length differences of the jitters is to perform a low-pass filtering procedure.*

*20. The jitter measuring method according to claim 17, wherein the step of calculating the length difference utilizes is to perform a subtraction procedure.*

*21. A jitter measuring device for measuring jitters in a digital signal, the jitter measuring device comprising:*

*a pulse length measuring unit for receiving the digital signal and a reference clock and measuring pulse length for each pulse of the digital signal according to the reference clock;*

*a pulse selecting unit for selecting the pulse lengths corresponding to a length selection signal as selected pulse lengths;*

*a length difference calculating unit for receiving the selected pulse lengths and calculating length difference for each selected pulse length; and*

*a jitter calculating unit for receiving the length differences and calculating an average of the length differences of the jitters.*

* * * * *